(12) United States Patent
Kinoshita

(10) Patent No.: US 6,225,205 B1
(45) Date of Patent: May 1, 2001

(54) METHOD OF FORMING BUMP ELECTRODES

(75) Inventor: Makoto Kinoshita, Tottori (JP)

(73) Assignee: Ricoh Microelectronics Company, Ltd., Tottori (JP)

( * ) Notice: Subject to any disclaimer, the term of this patent is extended or adjusted under 35 U.S.C. 154(b) by 0 days.

(21) Appl. No.: 09/234,706

(22) Filed: Jan. 21, 1999

(30) Foreign Application Priority Data

Jan. 22, 1998 (JP) .................................................. 10-025142

(51) Int. Cl.$^7$ .................................................... H01L 21/44
(52) U.S. Cl. ............................................ 438/613; 438/616
(58) Field of Search ................................. 438/613, 584, 438/597, 612, 615, 616

(56) References Cited

U.S. PATENT DOCUMENTS

| | | | |
|---|---|---|---|
| 5,492,863 | * | 2/1996 | Higgins, III . |
| 5,531,021 | * | 7/1996 | Kolman et al. . |
| 5,539,153 | * | 7/1996 | Schwiebert et al. . |
| 5,762,259 | * | 6/1998 | Hubacher et al. . |
| 5,783,465 | * | 7/1998 | Canning et al. . |
| 5,825,629 | * | 10/1998 | Hoebener et al. . |

* cited by examiner

Primary Examiner—Tuan H. Nguyen
Assistant Examiner—Evan Pert
(74) Attorney, Agent, or Firm—Oblon, Spivak, McClelland, Maier & Neustadt, P.C.

(57) ABSTRACT

A method of forming a plurality of bump electrodes en bloc on a bump electrode formation surface of a wafer from which chips are to be separated, or on an upper surface of a plurality of chips which are separated from a wafer and placed side by side, the upper surface constituting a bump electrode formation surface, is disclosed.

20 Claims, 8 Drawing Sheets

METHOD OF FORMING BUMP ELECTRODES

BACKGROUND OF THE INVENTION

1. Field of the Invention

The present invention relates to a method of forming a plurality of bump electrodes en bloc on a bump electrode formation surface of a wafer from which chips are to be separated, or on a bump electrode formation surface on an upper surface side of a plurality of chips which are separated from a wafer and placed side by side, specifically for use in condenser chips, resistance chips, IC chips, and CPU chips, which are mounted on a surface of electronic parts, and for use in packages semi-conductor-molded ball grid arrays (BGA) and chip size packages (CSP) and connectors.

2. Discussion of Background

In accordance with a recent trend of down-sizing and cost reduction of electronic parts, the above-mentioned chips are mounted on a surface of a substrate via bump electrodes. In particular, there is a tendency that electronic chips such as IC and LSI chips are mounted on the surface of electronic parts via bump electrodes as flip chips without being packaged.

In order to conduct such surface mounting of such electronic parts, it is considered to be preferable that bump electrodes be formed on the side of such electronic parts.

Conventionally, the above-mentioned bump electrodes are formed on the surface of the above-mentioned electronic parts by an electrolytic plating method comprising the steps of forming a predetermined resist pattern on the surface of the electronic parts by photolithography, and having the resist pattern grown to a predetermined thickness, using solder, or a metal such as gold or copper, or by a ball bump method of forming metal balls from a metal wire, and bonding the metal balls to the electronic parts. These conventional methods are used as methods for directly forming bump electrodes on electronic parts. These methods, however, have a shortcoming that many steps to be carried out are involved and accordingly are costly to conduct.

SUMMARY OF THE INVENTION

It is therefore a first object of the present invention to provide a method of forming a plurality of bump electrodes en bloc on a bump electrode formation surface of a wafer from which chips are to be separated, with high precision and at a low cost.

A second object of the present invention is to provide a method of forming a plurality of bump electrodes en bloc on an upper surface of a plurality of chips which are separated from a wafer and placed side by side, the upper surface constituting a bump electrode formation surface.

The first object of the present invention can be achieved by a method of forming a plurality of bump electrodes en bloc on a bump electrode formation surface of a wafer from which chips are to be separated, comprising the steps of:
mounting a stencil mask with through-holes for the formation of the bump electrodes on the bump electrode formation surface of the wafer, and
performing printing with an electroconductive paste through the through-holes of the stencil mask for the formation of the bump electrodes en bloc on the bump electrode formation surface of the wafer.

In the above-mentioned method, when the electroconductive paste is a photo-setting paste, it is preferable that the stencil mask comprise a light-shielding layer at least on such a side of the stencil mask that comes into close contact with the bump electrode formation surface of the wafer, and that the photo-setting paste filled in the through-holes be exposed to light and cured, and that the stencil mask be then separated from the bump electrode formation surface of the wafer so as to fix the cured photo-setting paste to the bump electrode formation surface of the wafer for the formation of the bump electrodes en bloc thereon. When the photo-setting paste is used as the electroconductive paste as mentioned above, micro-bump electrodes can be formed with high accuracy by the provision of the light-shielding layer at least on such a side of the stencil mask that comes into close contact with the bump electrode formation surface of the wafer.

In the above-mentioned method, the stencil mask may comprise a plastic material that can be selectively subjected to ablation working by light irradiation, for instance, visible light irradiation or ultraviolet light irradiation, so as to form the through-holes in the stencil mask. By use of such a plastic material in the stencil mask, through-holes with a smooth inner wall can be formed from which the electroconductive paste can be smoothly released, whereby high quality bump electrodes free of defects can be formed.

In the above-mentioned method, the electroconductive paste may be an elastomer resin paste. When an elastomer resin paste is used as the electroconductive paste, there can be formed such bump electrodes that comprise a highly elastic elastomer resin and are not cracked even when subjected to repeated thermal expansion and contraction.

In the above-mentioned method, each of the bump electrodes may have a thin or conical top edge. By causing the bump electrodes to have a thin or conical top edge, improper connection and crack formation can be prevented.

The first object of the present invention can also be achieved by a method of forming a plurality of bump electrodes en bloc on a bump electrode formation surface of a wafer from which chips are to be separated, comprising the steps of:
filling depressed portions of an intaglio printing mask for the formation of bump electrodes with a liquid metal or an electroconductive paste, and
performing printing with the liquid metal or the electroconductive paste filled in the depressed portions of said intaglio printing mask for the formation of the bump electrodes en bloc on the bump electrode formation surface of the wafer by bringing the intaglio printing mask into close contact with the bump electrode formation surface of the wafer so as to fix the liquid metal or the electroconductive paste thereon from the depressed portions of the intaglio printing mask.

In the above-mentioned method, the electroconductive paste may be a photo-setting paste, and when the electroconductive paste is a photo-setting paste, it is preferable that the intaglio printing mask be transparent so as to allow light to pass at least through the depressed portions of the intaglio printing mask, thereby curing the photo-setting paste in the depressed portions when exposed to light, and comprise a light-shielding layer at least on such a side of the intaglio printing mask that comes into close contact with the bump electrode formation surface of the wafer, and that the photo-setting paste be filled in the depressed portions, exposed to light and cured, and that the intaglio printing mask be then separated from the bump electrode formation surface of the wafer so as to fix the cured photo-setting paste to the bump electrode formation surface of the wafer for the formation of the bump electrodes en bloc thereon.

In the above-mentioned method, the intaglio printing mask may comprise a plastic material that can be selectively subjected to ablation working by light irradiation so as to form the depressed portions in the intaglio printing mask. By use of such a plastic material in the intaglio printing mask, depressed portions with a smooth inner wall and a bottom surface can be formed from which the electroconductive paste can be smoothly released, whereby high quality bump electrodes free of defects can be formed.

In the above-mentioned method, the electroconductive paste may be an elastomer resin paste for the same reasons as in the above-mentioned method using the stencil mask with the through-holes.

In the above-mentioned method, each of the bump electrodes may have a thin or conical top edge for the same reasons as in the above-mentioned method using the stencil mask with the through-holes.

The first object of the present invention can also be achieved by a method of forming a plurality of bump electrodes en bloc on a bump electrode formation surface of a wafer from which chips are to be separated, comprising the steps of:

forming an electroconductive photosensitive layer on the bump electrode formation surface of the wafer, exposing the electroconductive photosensitive layer to light through a photo mask for the formation of the bump electrodes en bloc on the bump electrode formation surface of the wafer, and developing the electroconductive photosensitive layer so as to form the bump electrodes en bloc on the bump electrode formation surface of the wafer.

In the above-mentioned method, the electroconductive photosensitive layer may be successively exposed to light through the photo mask for the formation of the bump electrodes en bloc, while a predetermined positional registration of the photo mask relative to the bump electrode formation surface of the wafer is maintained. By this method, the bump electrodes can be formed with high precision with respect to the relative positions thereof.

The second object of the present invention can be achieved by a method of forming a plurality of bump electrodes en bloc on an upper surface of a plurality of chips which are separated from a wafer and placed side by side, the upper surface constituting a bump electrode formation surface, comprising the steps of:

mounting a stencil mask with through-holes for the formation of the bump electrodes on the bump electrode formation surface, and performing printing with an electroconductive paste through the through-holes of the stencil mask for the formation of the bump electrodes en bloc on the bump electrode formation surface.

In the above-mentioned method, when the electroconductive paste is a photo-setting paste, it is preferable that the stencil mask comprise a light-shielding layer at least on such a side of the stencil mask that comes into close contact with the bump electrode formation surface of the wafer, and that the photo-setting paste filled in the through-holes be exposed to light and cured, and that the stencil mask be then separated from the bump electrode formation surface of the wafer so as to fix the cured photo-setting paste to the bump electrode formation surface of the wafer for the formation of the bump electrodes en bloc thereon. When the photo-setting paste is used as the electroconductive paste as mentioned above, micro-bump electrodes can be formed with high accuracy by the provision of the light-shielding layer at least on such a side of the stencil mask that comes into close contact with the bump electrode formation surface of the wafer.

In the above-mentioned method, the stencil mask may comprise a plastic material that can be selectively subjected to ablation working light irradiation, for example, by visible light irradiation or ultraviolet light irradiation, so as to form the through-holes in the stencil mask. By use of such a plastic material in the stencil mask, through-holes with a smooth inner wall can be formed from which the electroconductive paste can be smoothly released, whereby high quality bump electrodes free of defects can be formed.

In the above-mentioned method, the electroconductive paste may be an elastomer resin paste. When an elastomer resin paste is used as the electroconductive paste, there can be formed such bump electrodes that comprise a highly elastic elastomer resin and are not cracked even when subjected to repeated thermal expansion and contraction.

In the above-mentioned method, each of the bump electrodes may have a thin or conical top edge. By causing the bump electrodes to have a thin or conical top edge, improper connection and crack formation can be prevented.

The second object of the present invention can also be achieved by a method of forming a plurality of bump electrodes en bloc on an upper surface of a plurality of chips which are separated from a wafer and placed side by side, the upper surface constituting a bump electrode formation surface, comprising the steps of:

filling depressed portions of an intaglio printing mask for the formation of bump electrodes with a liquid metal or an electroconductive paste, and performing printing with the liquid metal or the electroconductive paste filled in the depressed portions of said intaglio printing mask for the formation of the bump electrodes en bloc on the bump electrode formation surface of the wafer by bringing the intaglio printing mask into close contact with the bump electrode formation surface so as to fix the liquid metal or the electroconductive paste thereon from the depressed portions of the intaglio printing mask.

In the above-mentioned method, the electroconductive paste may be a photo-setting paste, and when the electroconductive paste is a photo-setting paste, it is preferable that the intaglio printing mask be transparent so as to allow light to pass at least through the depressed portions of the intaglio printing mask, thereby curing the photo-setting paste in the depressed portions when exposed to light, and comprise a light-shielding layer at least on such a side of the intaglio printing mask that comes into close contact with the bump electrode formation surface, and that the photo-setting paste be filled in the depressed portions, exposed to light and cured, and that the intaglio printing mask be then separated from the bump electrode formation surface of the wafer so as to fix the cured photo-setting paste to the bump electrode formation surface for the formation of the bump electrodes en bloc thereon.

In the above-mentioned method, the intaglio printing mask may comprise a plastic material that can be selectively subjected to ablation working by light irradiation, for example, by visible light irradiation or ultraviolet light irradiation, so as to form the depressed portions in the intaglio printing mask. By use of such a plastic material in the intaglio printing mask, depressed portions with a smooth inner wall and a bottom can be formed, from which the electroconductive paste can be smoothly released, whereby high quality bump electrodes free of defects can be formed.

In the above-mentioned method, the electroconductive paste may be an elastomer resin paste for the same reasons as in the above-mentioned method using the stencil mask.

In the above-mentioned method, each of the bump electrodes may have a thin or conical top edge for the same reasons as in the above-mentioned method, using the stencil mask.

The second object of the present invention can also be achieved by a method of forming a plurality of bump electrodes en bloc on an upper surface of a plurality of chips which are separated from a wafer and placed side by side, the upper surface constituting a bump electrode formation surface, comprising the steps of:

forming an electroconductive photosensitive layer on the bump electrode formation surface, exposing the electroconductive photosensitive layer to light through a photo mask for the formation of the bump electrodes en bloc on the bump electrode formation surface, and developing the electroconductive photosensitive layer so as to form the bump electrodes en bloc on the bump electrode formation surface.

In the above-mentioned method, the electroconductive photosensitive layer may be successively exposed to light through the photo mask for the formation of the bump electrodes en bloc, while a predetermined positional registration of the photo mask relative to the bump electrode formation surface of the wafer is maintained. By this method, the bump electrodes can be formed with high precision with the respective positions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

With reference to accompanying drawings, examples of methods of forming bump electrodes of the present invention will now be explained, by which a plurality of bump electrodes can be formed en bloc on a bump electrode formation surface.

More specifically, according to the present invention, a plurality of bump electrodes can be formed en bloc, for instance, on a bump electrode formation surface of a wafer from which chips such as semiconductor chips are to be separated, or on an upper surface of a plurality of chips which are separated from a wafer and placed side by side, the upper surface constituting a bump electrode formation surface.

Figure 1A:
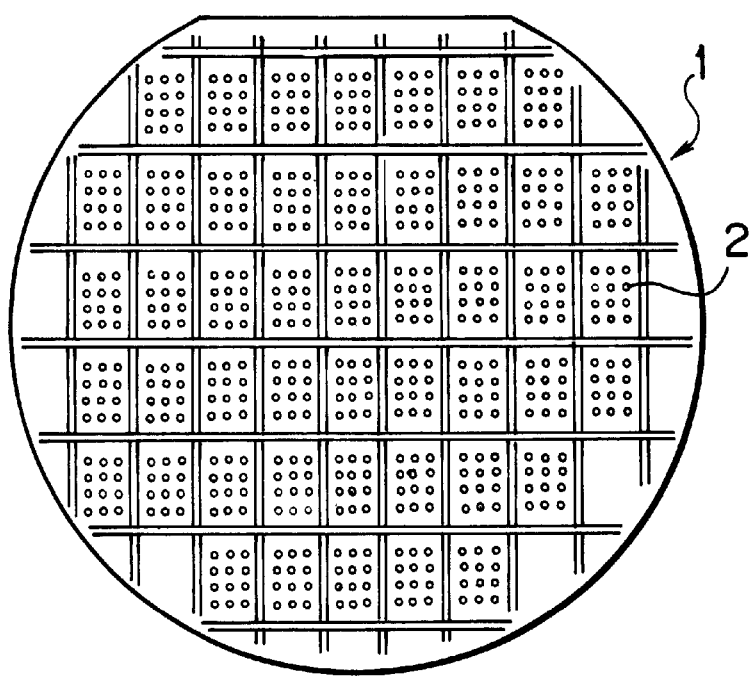
FIG. 1(a) is a schematic plan view of a wafer 1 from which semiconductor chips 4 are to be separated, with bump electrodes 2 being formed en bloc on a bump electrode formation surface of the wafer 1 by a bump electrode formation method of the present invention.
Figure 1B:
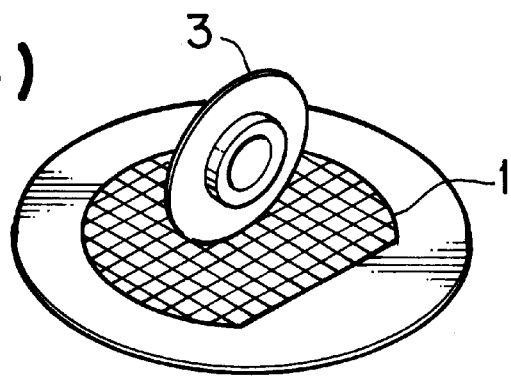
FIG. 1(b) is a schematic perspective view of the wafer 1 from which semiconductor chips 4 are separated.

FIG. 1(a) shows a wafer 1 from which semiconductor chips 4 are to be separated. On a bump electrode formation surface of the wafer 1 are formed bump electrodes 2 en bloc by a bump electrode formation method of the present invention.

Figure 1C:
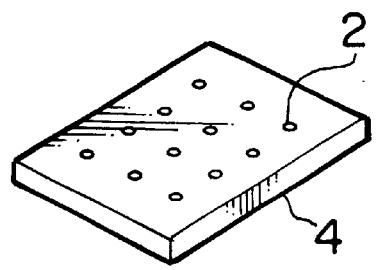
FIG. 1(c) is a perspective view of the separated semiconductor chip 4 on which the bump electrodes are formed by the method of the present invention.

The wafer 1 on which the bump electrodes 2 are formed en bloc is then cut by a dicing saw 3 as illustrated in FIG. 1(c) so as to be separated into semiconductor chips 4 as illustrated in FIG. 1(c), which can be mounted on a substrate.

EXAMPLE 1

Figure 2A:
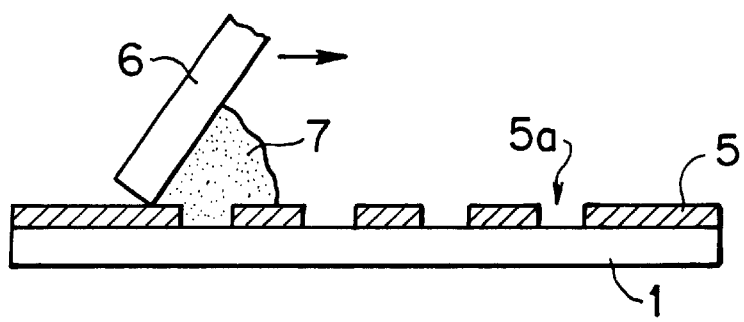
FIGS. 2(a) and 2(b) are diagrams in explanation of a first example of a bump electrode formation method of the present invention.

FIG. 2(a) is a diagram in explanation of a first example of the method of forming the bump electrodes 2 on the wafer 1 of the present invention.

As shown in FIG. 2(a), a stencil mask 5 with through-holes 5a for the formation of bump electrodes is mounted on a bump electrode formation surface of a wafer 1 from which semiconductor chips 4 are to be separated.

An electroconductive paste 7 containing therein fine particles with a particle diameter of 20 $\mu$m or less is brought into pressure contact with an upper surface of the stencil mask 5 with the through-holes 5a, using a squeegee 6 which is moved in the direction of the arrow along an upper surface of the stencil mask 5, whereby the through-holes 5a are filled with the electroconductive paste 7.

Figure 2B:
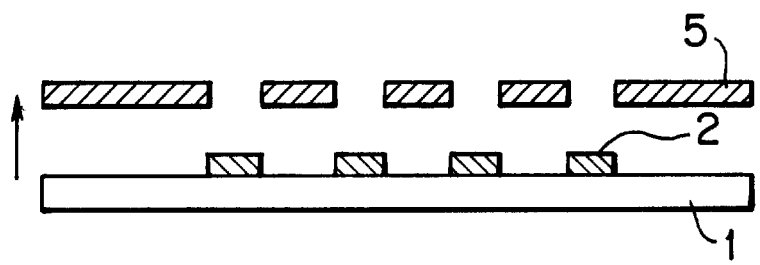

The stencil mask 5 is then removed from the wafer 1 in such a manner that the electroconductive paste 7 is printed in the form of bump electrodes 2 on the bump electrode formation surface of the wafer 1 as illustrated in FIG. 2(b). When necessary, the electroconductive paste 7 printed in the form of bump electrodes 2 on the bump electrode formation surface of the wafer 1 may be then subjected to reflow processing.

Figure 3A:
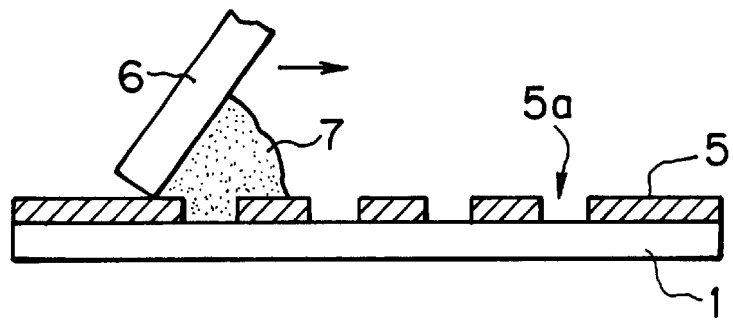
FIGS. 3(a) and 3(c) are diagrams in explanation of a modified first example of a bump electrode formation method of the present invention.
Figure 3B:
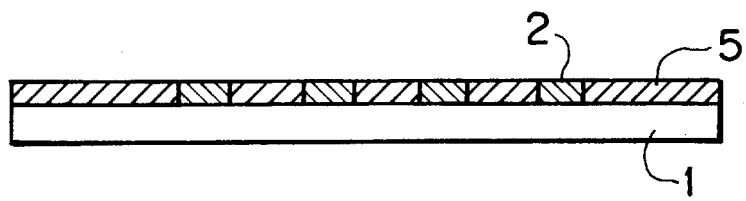
Figure 3C:
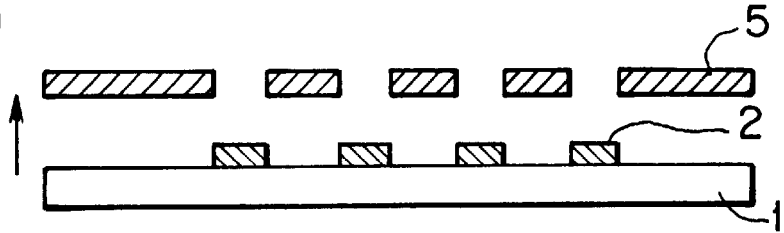

In the case that the releasability of the electroconductive paste 7 from the stencil mask 5 is poor when the stencil mask 5 is separated from the bump electrode formation surface of the wafer 1, it is preferable that the electroconductive paste 7 filled in the through-holes 5a of the stencil mask 5 be cured to form bump electrodes 2 en bloc before the stencil mask 5 is separated from the bump electrode formation surface of the wafer 1 as illustrated in FIG. 3(a) to FIG. 3(c).

In order to cure the electroconductive paste 7, it is preferable to use a thermosetting paste which can be cured by the application of heat thereto, or a photo-setting paste which can be cured by the exposure thereof to light.

Furthermore, as the electroconductive paste 7 for use in the present invention, a two-part electroconductive paste can also be employed, which can be cured chemically with time.

Thus, after the electroconductive paste 7 filled in the through-holes 5a of the stencil mask 5 is cured, the stencil mask 5 is separated from the bump electrode formation surface of the wafer 1, so that the bump electrodes 2 can be formed en bloc on the bump electrode formation surface of the wafer 1 as illustrated in FIG. 3(a) to FIG. 3(c).

When as the electroconductive paste 7, a photo-setting paste is used, it is preferable that the stencil mask 5 comprise a light-shielding layer at least on such a side of the stencil mask 5 that comes into close contact with the bump electrode formation surface of the wafer 1, since by the provision of the light-shielding layer at least on such a side of the stencil mask 5 that comes into close contact with the bump electrode formation surface of the wafer 1, micro-bump electrodes can be formed en bloc with high accuracy.

In the method of forming a plurality of bump electrodes en bloc on the bump electrode formation surface of the wafer from which chips are to be separated, using the stencil printing mask, the stencil mask may comprise a plastic material that can be selectively subjected to ablation working by light irradiation so as to form said through-holes in said stencil mask.

Furthermore, the electroconductive paste may be an elastomer resin paste.

EXAMPLE 2

Figure 4:
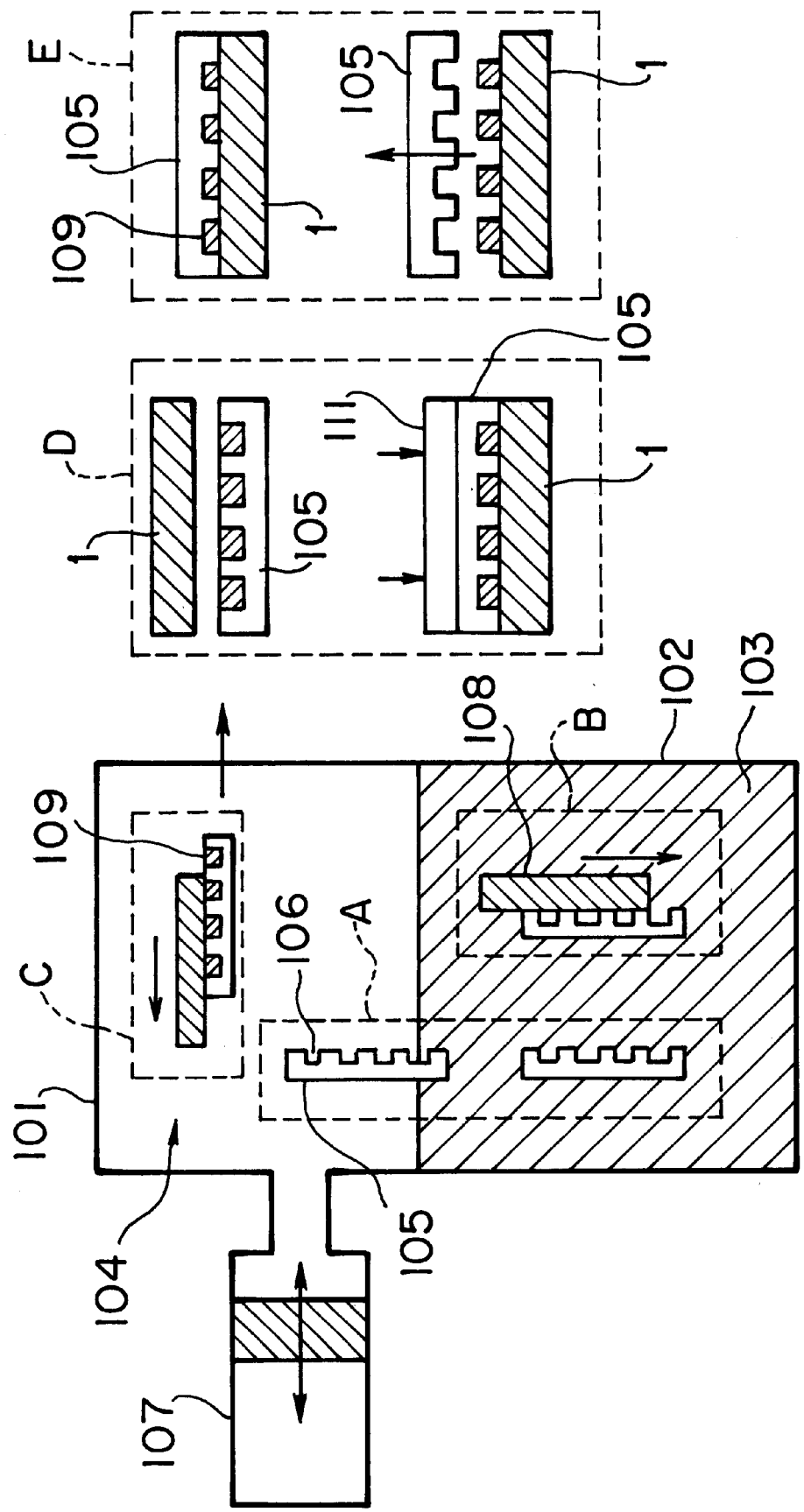
FIG. 4 is a diagram in explanation of a second example of a bump electrode formation method of the present invention.

FIG. 4 is a diagram in explanation of a second example of the method of forming bump electrodes of the present invention.

In FIG. 4, a lower portion of an airtight housing 101 constitutes a liquid metal container 102 in which a liquid metal 103, such as a eutectic solder or a high-temperature solder, serving as a material for the formation of the bump electrodes, is held at a liquid temperature thereof, for example, at 183° C., or above. In an upper portion of the housing 101, an inert gas 104 such as nitrogen gas for preventing the oxidation of the liquid metal 103 is filled.

In Step A in FIG. 4, an intaglio printing mask 105 made of a plastic material with slight elasticity, having depressed portions 106 in a female die shape of the bump electrodes 2, is placed in the inert gas 104 within the airtight housing 101. By reducing the pressure of the inert gas 104 by a pressure increasing and decreasing apparatus 107, gases remaining in the depressed portions 106 of the intaglio printing mask 105 are removed therefrom. The thus deaerated intaglio printing mask 105 is then immersed in the liquid metal 103. The pressure of the inert gas 104 is then increased by the pressure increasing and decreasing apparatus 107, whereby pressure is applied to the liquid metal 103, so that the depressed portions 106 are completely filled with the liquid metal 103 without any unfilled space in the depressed portions 106 of the intaglio printing mask 105.

In Step B, after the complete filling of the liquid metal 103 in the depressed portions 106 of the intaglio printing mask 105, a shielding plate 108 having a flat contact surface is brought into close and sliding contact with the surface of the intaglio printing mask 105 in such a manner that the flat contact surface of the shielding plate 108 comes into contact with the surface of the intaglio printing mask 105 on the side of the openings of the depressed portions 106 of the intaglio printing mask 105, thereby removing therefrom the liquid metal 103 which stays on the surface of the intaglio printing mask 105, closing the openings of the depressed portions 106 of the intaglio printing mask 105 with the shielding plate 108, whereby the liquid metal 103 is completely removed from between the surface of the intaglio printing mask 105 and the shielding plate 108, and a constant amount of the liquid metal 103 is always filled in the depressed portions 106.

In Step C, the intaglio printing mask 105 with the liquid metal 103 being filled in the depressed portions 106 thereof is taken out from the liquid metal 103, together with the shielding plate 108 which is closely attached to the printing mask 105, and then the intaglio printing mask 105 is horizontally positioned in such a posture that the depressed portions 106 filled with a liquid metal 109 is directed upward. The shielding plate 108 is then slid and removed from the intaglio printing mask 105.

In Step D, a wafer 1 from which chips are to be separated in preheated for easing heat shock, and with the bump electrode formation surface thereof being directed downward, is then brought into close contact with the intaglio printing mask 105 at a predetermined position, and is turned upside-down. Slight pressure is applied to the intaglio printing mask 105 and the wafer 1 by a pressure application apparatus 111. Due to the elasticity of the intaglio printing mask 105 made of a plastic material, the liquid metal 109 filled in the depressed portions 106 of the intaglio printing mask 105 is securely brought into close contact with the wafer 1.

It is preferable that an opposite side of the wafer 1 to the bump electrode formation surface thereof, where no bump electrodes are formed, be protected with masking.

In Step E, the intaglio printing mask 105 and the wafer 1 are gradually cooled, and after the liquid metal 109 in the depressed portions 106 is solidified, the intaglio printing mask 105 is separated from the wafer 1, whereby the solidified liquid metal 109 filled in the depressed portions 106 of the intaglio printing mask 105 is transferred in the printing shape corresponding to the shape of the depressed portions 106 to the wafer 1.

By the above-mentioned method, the bump electrodes for connection of flip chips can be uniformly formed en bloc on the bump electrode formation surface of the wafer 1 at low cost.

It is considered that the depressed portions 106 of the intaglio printing mask 105 can be formed by various methods such as mechanical working, photolithography, and plating. However, these methods have the shortcomings that the finer the bumps, the more difficult the production, and the higher the production cost. These problems can be solved by forming the depressed portions 106 in a printing shape in such a plastic plate that can be subjected to ablation working, using visible light or ultraviolet light such as excimer laser. Fine and small bump female die portions and grooves corresponding to fine bump electrodes, depressed below the surface of the plastic plate, can be precisely formed by excimer laser engraving work.

It is preferable that a material for the intaglio printing mask 105 for use in the present invention have substantially the same coefficient of thermal expansion as that of the material on which the bump electrodes are to be formed en bloc. For example, when the material on which the bump electrodes are to be formed is a silicon wafer, it is preferable that the intaglio printing mask 105 be made of a metal material such as Kovar.

The intaglio printing mask 105 may be made of such an elastic material that can be deformed, following the thermal deformation of the wafer serving as the material on which the bump electrodes are to be formed, even when the wafer is thermally expanded.

In the above, the case where the liquid metal is used is explained. However, it is also possible to use electroconductive pastes. Representative examples of electroconductive pastes that can be used in the present invention are electroconductive adhesive agents, anisotropic electroconductive adhesive agents, electroconductive polymers, cream solders, tin pastes, silver pastes, silver palladium paste, and carbon paste. When electroconductive adhesive agents, anisotropic electroconductive adhesive agents, electroconductive polymers, or carbon pastes are used, it is unnecessary to liquify such pastes, and therefore heating and cooling of the pastes which are necessary for the pastes to be liquid are unnecessary. It is only necessary to separate the intaglio printing mask from the wafer after the paste has cured.

In contrast, when cream solder, tin paste, silver paste, or silver palladium paste are used, any of these pastes is filled in the depressed portions of the intaglio printing mask at room temperature, and the intaglio printing mask is brought into close contact with the bump electrode formation surface of the wafer, and is subjected to reflow with the intaglio printing mask being in contact with the wafer, and the paste is liquid, then cooled and solidified, and then the intaglio printing mask is separated from the bump electrode formation surface of the wafer.

When such a paste that needs the liquifying thereof is used, the wafer is usually placed with the bump electrode formation surface thereof up, and the intaglio printing mask is overlaid thereon with the openings of the depressed portions of the printing mask down, in close contact with the bump electrode formation surface of the wafer, followed by the reflow.

The pastes which require the liquifying contain a flux in an amount of about 50%, so that the liquid metal cannot occupy the entire space of the depressed portions 106 of the above-mentioned intaglio printing mask 105. Therefore, when conical bumps are formed with the top end portions being directed upward, the upper end portion of the depressed portions 106 is filled with a flux with a smaller specific gravity, so that bumps without the top end portions are formed. However, in the method of forming conical bumps with the intaglio printing mask 105 being turned sideways, a lacking portion at the top end can be moved to one side of the conical bumps, so that the shape of pillar-shaped bumps after the reflow is substantially the same as the shape of the pillar-shaped bumps after the reflow which can be achieved by the conical bump shape, and the effect of reducing stress can be maintained.

EXAMPLE 3

Figure 5:
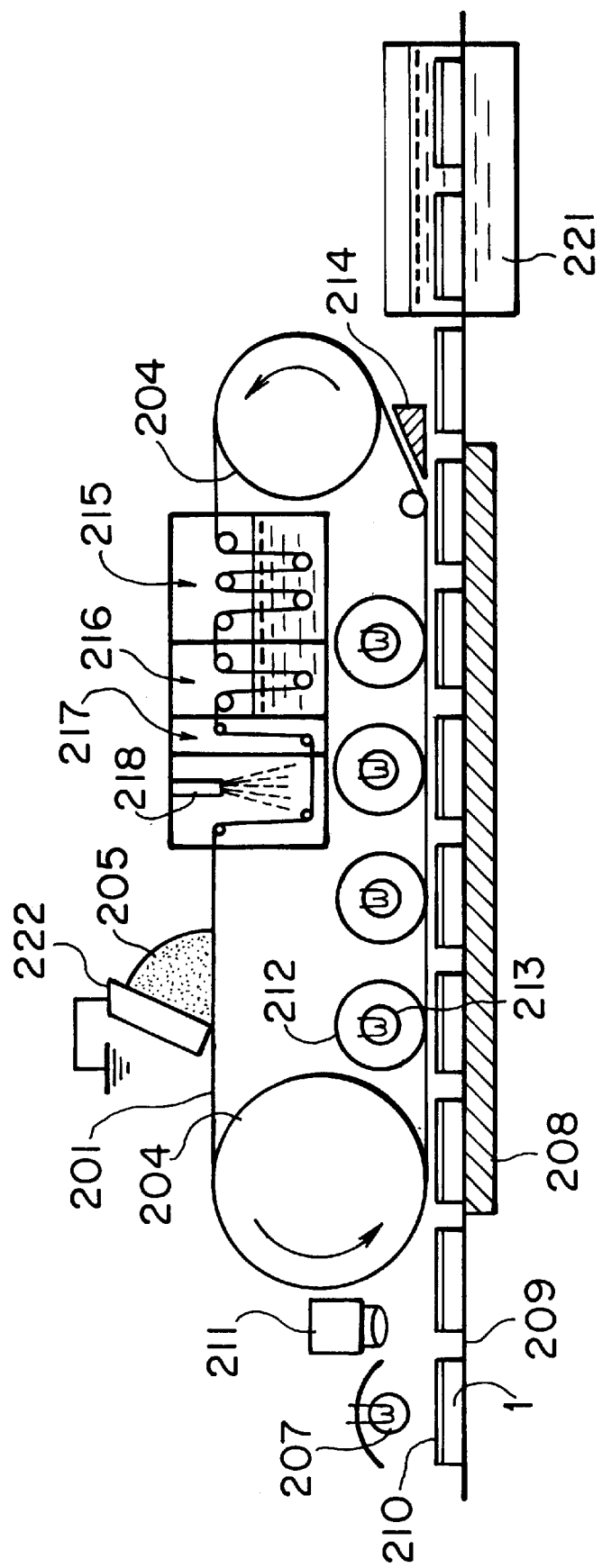
FIG. 5 is a schematic diagram in explanation of a third example of a bump electrode formation method of the present invention, using a bump electrode formation apparatus.

FIG. 5 is a schematic diagram in explanation of a third example of the method of forming bump electrodes of the present invention, using a bump electrode formation apparatus.

In FIG. 5, an intaglio printing mask 201 is in the shape of the endless belt and is rotated in the direction of the arrows by a pair of drive apparatus 204 disposed on the left side and the right side of the intaglio printing mask 201.

Figure 6:
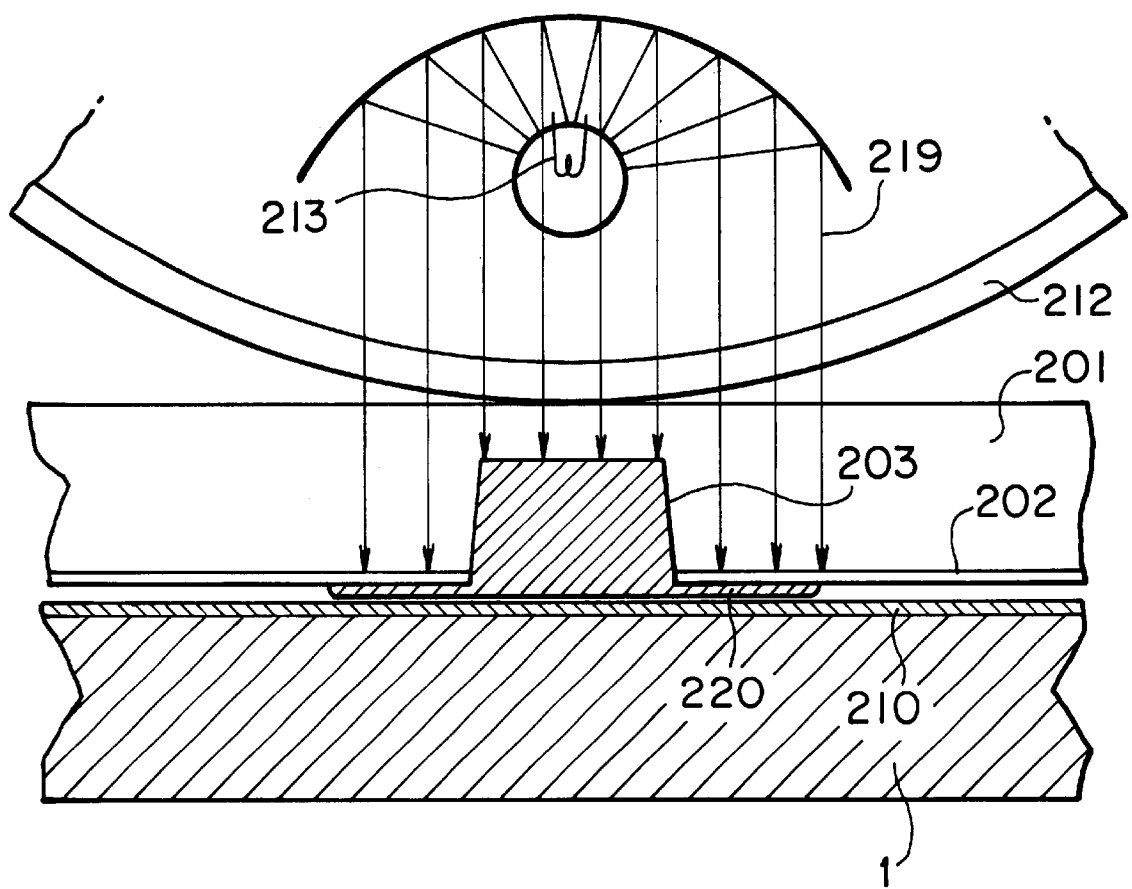
FIG. 6 is an enlarged schematic diagram in explanation of an exposure step and a curing step in a transfer process in the bump electrode formation apparatus shown in FIG. 5 in the third example of the bump electrode formation method of the present invention.

The top surface of the intaglio printing mask 201 is coated with a thin film 202, such as a film of titanium oxide which is hard, opaque and abrasion resistant, and depressed portions 203 for the formation of bump electrodes are formed in the intaglio print mask 201 as shown in FIG. 6, which is an enlarged view in explanation of the exposure and curing step in a transfer process in the bump electrode formation apparatus.

When each depressed portion 203 of the intaglio printing mask 201 comes to the position of a squeegee 222, which is treated so as to be electroconductive in the course of the rotation of the intaglio printing mask 201, each depressed portion 203 is filled with an elastomeric ultraviolet curing resin paste 205. With further rotation of the intaglio printing mask 201, the depressed portion 203 proceeds toward a transfer process.

A wafer 1 in which semiconductor elements are already formed and from which chips are to be separated is caused to pass through a surface modification ultraviolet radiation apparatus 207 for improving the wettability of the wafer 1, and transported, with a bump electrode formation surface 210 of the wafer 1 being directed upward, to the transfer process by a transport apparatus 209 which is moved along a fixing table 208. The depressed portions 203 of the intaglio printing mask 201 are brought into close contact with the wafer 1 after an positional shift between the depressed portions 203 of the intaglio printing 201 and the wafer 1 has been measured and removed for registration by an image recognition apparatus 211 which is disposed at a leading position of the transfer process.

The elastomeric ultraviolet curing resin paste 205, which is filled in the depressed portions 203 of the intaglio printing mask 201, is further brought into pressure contact with the surface of the wafer 1, cured and fixed to the wafer 1 by a roller 212 made of quartz glass (hereinafter referred to as the quartz glass roller 212) having excellent transparency with respect to ultraviolet light, and an ultraviolet lamp 213 for curing resin, which is built in a vacant portion of the quartz glass roller 212, as shown in FIG. 6.

More specifically, with reference to FIG. 6, the intaglio printing mask 201 is in close contact with the bump electrode formation surface 210 of the wafer 1, which is directed upward. In the depressed portions 203 of the intaglio printing mask 201, directed to the side of the wafer 1, there is filled the elastomeric ultraviolet curing resin paste 205 which is not yet cured. To the elastomeric ultraviolet curing resin paste 5 is applied pressure by the quartz glass roller 212 which applies pressure to the intaglio printing mask 201, so that the adhesion of the ultraviolet curing resin paste 205 to the bump electrode formation surface 210 of the wafer 1 is accelerated.

The inside of the quartz glass roller 212 is radiated with ultraviolet light 219 emitted from the ultraviolet lamp 213. The ultraviolet light 219 passes through the transparent intaglio printing mask 201 and cures the ultraviolet curing resin filled in the depressed portion 203, provided that a light shielding thin layer 202 through which ultraviolet light does not pass is coated on the surface of the intaglio printing master 1 around the depressed portion 203, so that an ultraviolet curing resin 220 which spreads beyond the depressed portion 203, if any, is not radiated with the ultraviolet light 219. Thus, the ultraviolet curing resin 220 is not radiated, and accordingly is not cured when the exposure is finished.

With reference to FIG. 5, in a panel washing chamber 221, the uncured ultraviolet curing resin 20 can be easily removed and does not remain on the bump electrode formation surface of the wafer 1, so that an unnecessary insulating layer is not formed from such an ultraviolet curing resin remaining on the surface of the wafer 1, which, if any, may impair the function of the chips prepared from the wafer 1.

With further movement of the endless-belt-shaped intaglio printing mask 201, the intaglio printing mask 1 reaches a separation apparatus 214 at which the intaglio printing mask 201 is separated from the surface of the wafer 1, so that the elastomeric ultraviolet curing resin 5 is transferred to the surface of the wafer 1.

After the transfer of the elastomeric ultraviolet curing resin 205 from the intaglio printing mask 201 to the surface of the wafer 1, the intaglio printing mask 201 is transported, passing over the drive apparatus 204, into an intaglio printing mask belt cleaning apparatus 215, where the uncured resin and foreign materials such as glass pieces (cullet) are removed from the surface of the intaglio printing mask 201.

The intaglio printing mask 201 is then rinsed with a rinsing agent in a rinse chamber 216 and dried in a drying chamber 217. The intaglio printing mask 201 is then subjected to a pre-treatment process for releasing property improvement treatment in a releasing agent application apparatus 218 and is returned to the resin paste filling process. Thus, the intaglio printing mask 201 is circulated through the pre-treatment process for the application of the release agent, the resin paste filling process using the squeegee, the transfer process of bringing the intaglio printing mask 201 into close contact with the bump electrode formation surface of the wafer 1, and the after-treatment process including the steps of washing and drying the intaglio printing mask 201, whereby the intaglio printing mask 201 can be repeatedly used for repeated bump electrode formation by printing.

In the above-mentioned processes through which the intaglio printing mask 201 is circulated, it is preferable that at least the atmosphere in the resin paste filling process up to the transfer process be an atmosphere of reduced pressure or in vacuum in order to prevent the formation of air bubbles in the resin paste or to prevent air from entering the depressed portions of the printing mask 201 in the resin paste filling process, and also in order to make it easy to separate the intaglio printing mask 201 from the bump electrode formation surface of the wafer 1 in the transfer process, since in the atmospheric pressure, the separation of the printing mask 201 from the surface of the wafer 1 tends to become difficult.

Furthermore, for destaticizing the materials employed in the above-mentioned processes, it is preferable that various antistatic steps be taken in the course of the above-mentioned processes, for instance, using an ionizer.

Thus, by the third example of the method of forming the bump electrodes, micro-bump electrodes can be formed en bloc with high accuracy and at low cost on the surface of the wafer 1.

As mentioned above, in the method of forming a plurality of bump electrodes en bloc on the bump electrode formation surface of the wafer from which chips are to be separated, using the intaglio printing mask, when the electroconductive paste is a photo-setting paste, it is preferable that the intaglio printing mask be transparent so as to allow light to pass at least through the depressed portions of the intaglio printing mask, thereby curing the photo-setting paste in the depressed portions when exposed to light, and comprise a light-shielding layer at least on such a side of the intaglio printing mask that comes into close contact with the bump electrode formation surface of the wafer, and that the photo-setting paste be filled in the depressed portions, exposed to light and cured, and that the intaglio printing mask be then separated from the bump electrode formation surface of the wafer so as to fix the cured photo-setting paste to the bump electrode formation surface of the wafer for the formation of the bump electrode en bloc therein.

The intaglio printing mask for use in the above-mentioned method may comprise a plastic material that can be selectively subjected to ablation working by light irradiation so as to form the depressed portions in the intaglio printing mask.

EXAMPLE 4

A plurality of bump electrodes can be formed en bloc on a bump electrode formation surface of a wafer from which chips are to be separated, comprising the steps of forming an electroconductive photosensitive layer on the bump electrode formation surface of the wafer, exposing the electroconductive photosensitive layer to light through a photo mask for the formation of the bump electrodes en bloc on the bump electrode formation surface of the wafer, and developing the electroconductive photosensitive layer so as to form the bump electrodes en bloc on the bump electrode formation surface of the wafer.

In the above-mentioned method, the electroconductive photosensitive layer may be successively exposed to light through the photo mask for the formation of the bump electrodes en block, for instance, in an area for forming one or more chips, or part of one chip, while a predetermined positional registration of the photo mask relative to the bump electrode formation surface of the wafer is maintained. By this method, the bump electrodes can be formed with high precision with respect to the relative positions thereof.

It is preferable that the stencil mask and the intaglio printing mask for use in the present invention comprise a plastic material that can be selectively subjected to abrasion working by light irradiation, for instance, by visible light or by ultraviolet light, so as to form the through-holes of the stencil mask and the depressed portions of the intaglio printing mask, whereby the inner walls of the through-holes and the depressed portions can be made smooth, so as to obtain high releasability of the electroconductive paste from the through-holes and the depressed portions. By use of the stencil mask and the intaglio printing mask, flawless, high quality bump electrodes can be formed.

Figure 7A:
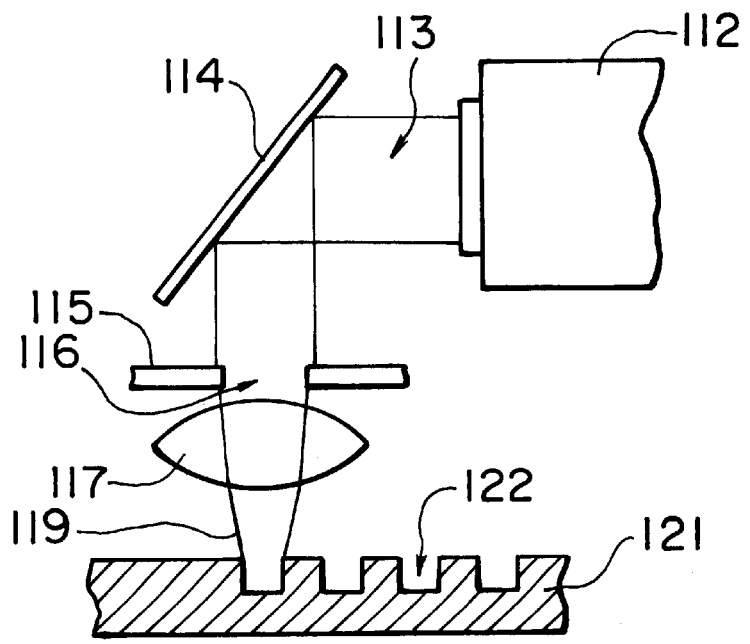
FIG. 7(a) and FIG. 7(b) are schematic diagrams in explanation of methods of forming depressed portions in a plastic material by ablation working, using an excimer laser to prepare an intaglio printing mask.
Figure 7B:
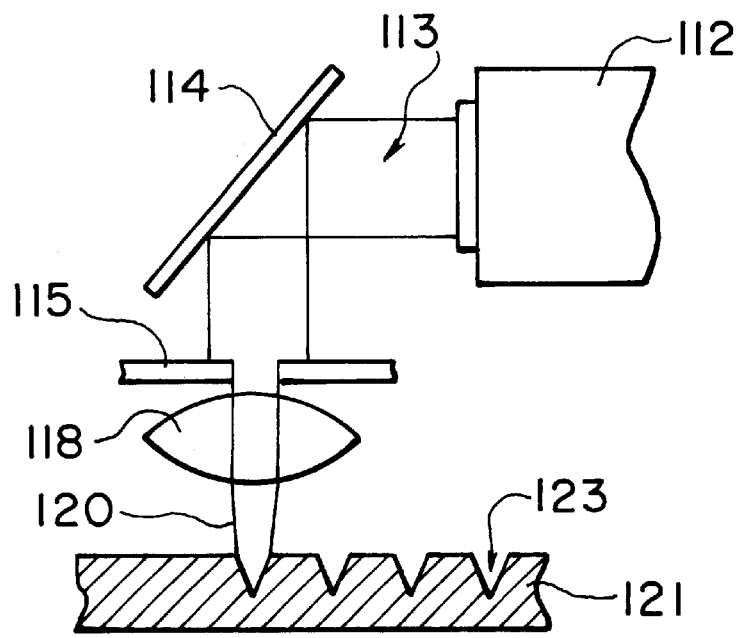

With reference to FIG. 7(a) and FIG. 7(b), a method of forming depressed portions in a plastic material by ablation working, using an excimer laser that can emit ultraviolet light, to prepare an intaglio printing mask, will now be explained.

In FIG. 7(a), a laser beam 113 emitted from an excimer laser generator 112 is corrected with respect to the traveling direction and the aberration of the optical axis thereof by a mirror 114 placed in the optical path of the laser beam 113, and then subjected to form adjustment by an optical shielding plate 115 for pattern setting, and patterned to form a patterned excimer laser beam 116. The excimer laser beam 116 is then condensed so as to have a necessary energy density, by an image lens 117 or an image lens 118 (refer to FIG. 7(b)), and projected to the surface of a plastic plate 121 which is to be used as an intaglio printing mask, whereby ablation working is carried out on the plastic plate 121.

As a result, as shown in FIG. 7(a), a worked hole 122 with a small tapering is formed by an excimer laser beam 119 which is condensed so as to have a high energy density by the image lens 117 with a large condensation ratio, while as shown in FIG. 7(b), a worked hole 123 with a large tapering is formed by an excimer laser beam 120 which is condensed so as to have a low energy density by the image lens 118 with a small condensation ratio.

It is preferable that each of the bump electrodes formed en bloc on the wafer 1 in the above-mentioned examples have a thin top edge, for instance, a conical top edge.

A mask for forming the bump electrodes with such a thin top edge as mentioned above can be formed, using the above-mentioned excimer laser.

The top angle of a cone formed by the excimer laser can be set as desired, and a conical depressed portion can be formed in the plastic plate as desired, regardless of the top angle thereof, with an obtuse angle top or an acute angle top. For instance, a depressed portion in the shape of a circular cylinder, a depressed portion in the shape of a cone, and a depressed portion in the shape of a frustum of a cone can be easily formed. Furthermore, not only the depressed portions with a circular horizontal cross-section, but also depressed portions with a quadrangular horizontal cross-section, for instance, a depressed portion in the shape of a quadrangular prism, a depressed portion in the shape of a quandrangular pyramid, and a depressed portion in the shape of a frustum of a quandrangular pyramid can be easily formed by excimer laser working, by using a light shielding plate with the opening in the shape corresponding to the above-mentioned respective shape.

Figure 8A:
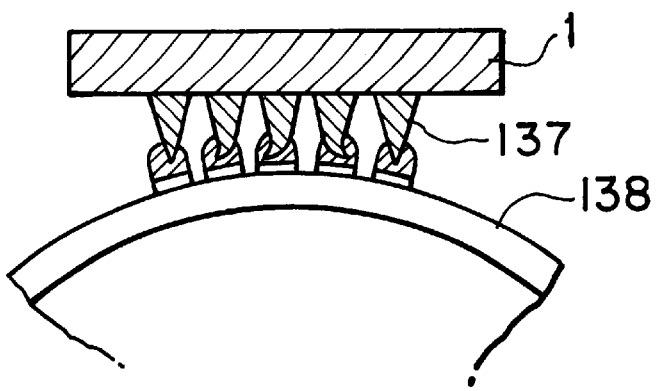
FIG. 8(a) and FIG. 8(b) are schematic diagrams in explanation of the effects of a conical bump electrode with an acute top angle.
Figure 8B:
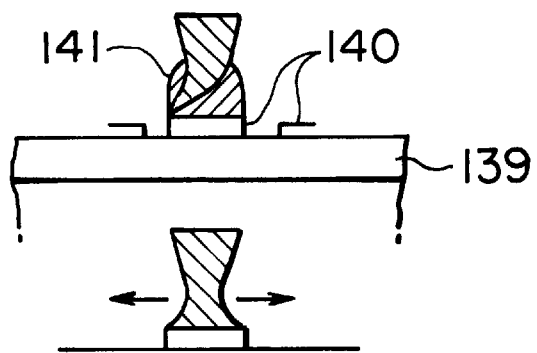

When bump electrodes in the form of a cone with an acute angle top are formed on the wafer 1 by using an intaglio printing mask with bump female die portions in the form of a cone with an acute angle top, if a substrate 138 is bent as shown in FIG. 8(a), or a pad on the side of the substrate is provided on a substrate with concave and convex portions on the upper surface thereof, the bending and the concave and convex portions can be absorbed by the easy deformation of the thin top end portion of the bump electrodes, so that the occurrence of improper junction such as opening, which occurs frequently in the conventional injection bumps, can be effectively prevented.

Figure 9A:
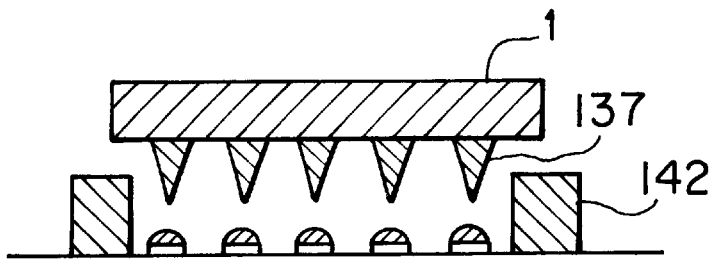
FIG. 9(a) and FIG. 9(b) are schematic diagrams in explanation of the formation of pillar-shaped bump electrodes.
Figure 9B:
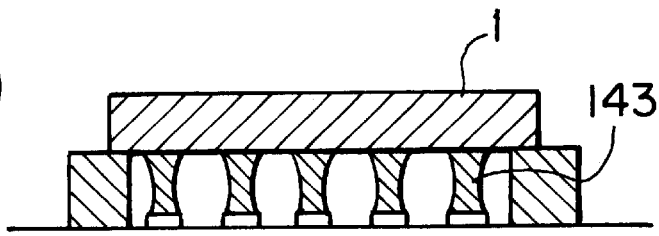

Furthermore, in order to reduce the stress generated by the difference in the thermal coefficient of expansion between a substrate and a package, as shown in FIG. 9(a), stud bumps 142 for holding the package at the time of reflow and preventing the dropping of the package, and conical bumps 137 are used in combination, whereby pillar-shaped bumps 143 can be realized as shown in FIG. 9(b). By use of such conical bumps 37, the junction of the pillar-shaped bumps, which is difficult to achieve by the conventional method, can be easily achieved, so that the stress between the substrate and the package as in BGA, CSP and in the bump type junctions as flip chips can be reduced, and the occurrence of cracks in the junction can be prevented, with the achievement of high reliability.

Furthermore, by use of the printing mask 5 with the depressed portions 6 thereof being in the form of the grooves corresponding to a wiring pattern to be formed on a printed circuit board such as a printing wiring board (PWB), the wiring pattern can be formed on the printed circuit board.

By us of such conical bump electrodes 137, the junction of the pillar-shaped bumps, which is difficult to achieve by the conventional method, can be easily achieved, so that the stress between the substrate and the package as in BGA, CSP and in the bump type junctions as flip chips can be reduced, and the occurrence of cracks in the junction can be prevented, with the achievement of high reliability.

In the above-mentioned examples, the formation of the bump electrodes en bloc on the wafer 1 in which a plurality of semiconductor elements is formed has been explained. The present invention can also be applied to BGA with the molded semiconductor chips, CSP type packages and connectors for the formation of bump electrodes thereon, since the effects of the present invention can also be obtained in the application of the present invention to such BGA with molded semiconductor chips, CSP type packages and connectors.

Furthermore, in the above-mentioned examples, the formation of the bump electrodes en bloc on the bump electrode formation surface of the wafer from which chips are to be separated has been explained. However, the present invention is not limited to such bump electrode formation surface, but can be applied to an upper surface of a plurality of chips which are separated from a wafer and placed side by side, which upper surface constitutes a bump electrode formation surface on which a plurality of bump electrodes can be formed en bloc in the same manner as in the above-mentioned examples.

The following is an example of the formation of a plurality of bump electrodes en bloc on the upper surface of a plurality of chips separated from a wafer and placed side by side as mentioned above.

EXAMPLE 5

Figure 10A:
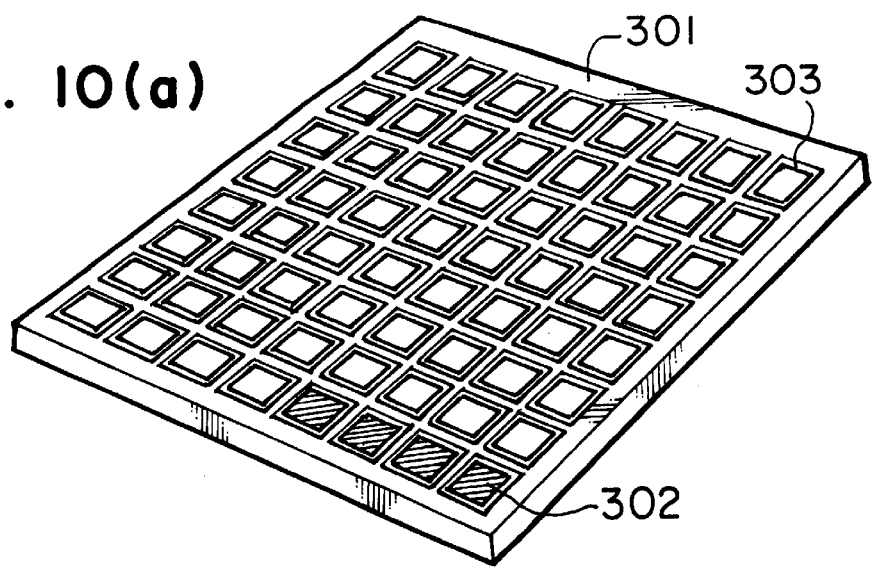
FIG. 10(a) is a schematic perspective view of a tray for registration of chips.
Figure 10B:
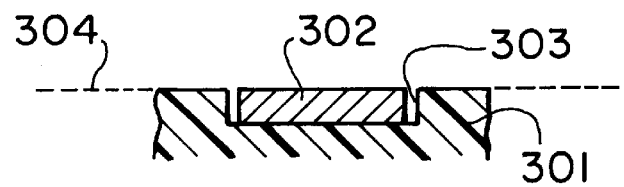
FIG. 10(b) is a schematic partial cross-sectional view of the tray, showing that the chips are fitted in the depressed portions of the tray shown in FIG. 10(a).
Figure 10C:
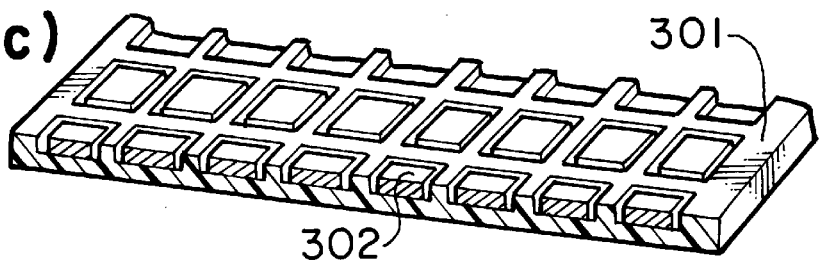
FIG. 10(c) is a schematic partial perspective view of the tray, showing that the chips are fitted in the depressed portions of the tray shown in FIG. 10(a).

FIG. 10(a) is a perspective view of a tray 301 for registration of chips 302, each of which chips 302 is fitted in a depressed portion 303 formed in the tray 302. As shown in FIG. 10(a), the chips 302 are arranged in such a manner that the respective upper surfaces of the arranged chips 302 are at the same level as the upper surface of the tray 301 as indicated by a broken line 304 in FIG. 10(b), so that the upper surfaces of the arranged chips 302 constitute a bump electrode formation surface on which the chips 302 can be formed en bloc.

Figure 10D:
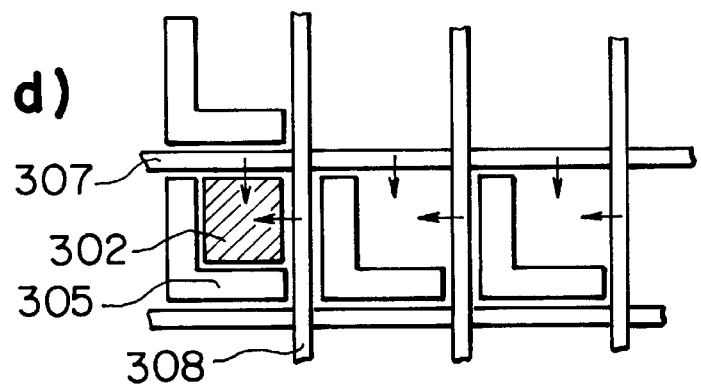
FIG. 10(d) is a schematic plan view of the chips placed in the depressed portions of the tray for accurate registration thereof, using registration guide members.

For accurate registration of each chip 305 in each depressed portion 303, a registration guide 305 for X an Y direction ends of each chip 305 can be used in combination with a Y-direction holding guide 307 which pushes the chip 302 in the direction of the arrow and an X-direction holding guide 308 which pushes the chip 302 in the direction of the arrow so as to hold each chip 305 in a predetermined right position as illustrated in FIG. 10(d).

On the thus formed bump electrode formation surface of a plurality of chips 303, bump electrodes can be formed, using the same stencil mask as used in Example 1, the same intaglio printing mask as used in Example 2 and Example 3, and the electroconductive photosensitive layer and the photo mask as in Example 4, in the same manner as in the respective Examples 1 to 4.

Japanese Patent Application No. 10-025142 filed Jan. 22, 1998, is hereby incorporated by reference as non-essential subject matter.

What is claimed is:

1. A method of forming a plurality of bump electrodes en bloc on a bump electrode formation surface of a wafer from which chips are to be separated, comprising the steps of:

mounting a stencil mask with through-holes for the formation of said bump electrodes on said bump electrode formation surface of said wafer, and performing printing with an electroconductive paste through said through-holes of said stencil mask for the formation of said bump electrodes en block on said bump electrode formation surface of said wafer, wherein said stencil mask comprises a light-shielding layer at least on such a side of said stencil mask that comes into close contact with said bump electrode formation surface of said wafer, said electroconductive paste is a photo-setting paste which is filled in said through-holes, exposed to light and cured, and said stencil mask is then separated from said bump electrode formation surface of said wafer so as to fix said cured photo-setting paste to said bump electrode formation surface of said wafer for the formation of said bump electrodes en bloc thereon.

2. The method as claimed in claim 1, wherein said stencil mask comprises a plastic material that can be selectively subjected to ablation working by light irradiation so as to form said through-holes in said stencil mask.

3. The method as claimed in claim 1, wherein said electroconductive paste is an elastomer resin paste.

4. The method as claimed in claim 1, wherein said bump electrodes each have a conical shape.

5. A method forming a plurality of bump electrodes en bloc on a bump electrode formation surface of a wafer from which chips are to be separated, comprising the steps of:

filling depressed portions of an intaglio printing mask for the formation of bump electrodes with a liquid metal or an electroconductive paste, and performing printing with said liquid metal or said electroconductive paste filled in said depressed portions of said intaglio printing mask for the formation of said bump electrodes en bloc on said bump electrode formation surface of said wafer by bringing said intaglio printing mask into close contact with said bump electrode formation surface of said wafer so as to fix said liquid metal of said electroconductive paste thereon from said depressed portions of said intaglio printing mask, wherein said electroconductive paste is a photo-setting paste, and said intaglio printing mask is transparent so as to allow light to pass at least through said depressed portions of said intaglio printing mask, thereby curing said photo-setting paste in said depressed portions when exposed to light, and comprises a light-shielding layer at least on such a side of said intaglio printing mask that comes into close contact with said bump electrode formation surface of said wafer, and said photo-setting paste is filled in said depressed portions, exposed to light and cured, and said intaglio printing mask is then separated from said bump electrode formation surface of said wafer so as to fix said cured photo-setting paste to said bump electrode formation surface of said wafer for the formation of said bump electrodes en bloc thereon.

6. The method as claimed in claim 5, wherein said intaglio printing mask comprises a plastic material that can be selectively subjected to ablation working by light irradiation so as to form said depressed portions in said intaglio printing mask.

7. The method as claimed in claim 5, wherein said electoconductive paste is an elastomer resin paste.

8. The method as claimed in claim 5, wherein said bump electrodes each have a conical shape.

9. A method of forming a plurality of bump electrodes en bloc on an upper surface of a plurality of chips which are separated from a wafer and placed side by side, said upper surface constituting a bump electrode formation surface, comprising the steps of:

aligning the plurality of chips in a tray, mounting a stencil mask with through-holes for the formation of said bump electrodes on said bump electrode formation surface, and performing printing with an electroconductive paste through said through-holes of said stencil mask for the formation of said bump electrodes en bloc on said bump electrode formation surface.

10. The method as claimed in claim 9, wherein said stencil mask comprises a light-shielding layer at least on such a side of said stencil mask that comes into close contact with said bump electrode formation surface, said electroconductive paste is a photo-setting paste which is filled in said through-holes, exposed to light and cured, and said stencil mask is then separated from said bump electrode formation surface so as to fix said cured photo-setting paste to said bump electrode formation surface for the formation of said bump electrodes en bloc thereon.

11. The method as claimed in claim 9, wherein said stencil mask comprises a plastic material that can be selectively subjected to ablation working by light irradiation so as to form said through-holes in said stencil mask.

12. The method as claimed in claim 9, wherein said electroconductive paste is an elastomer resin paste.

13. The method as claimed in claim 9, wherein said bump electrodes each have a conical shape.

14. A method of forming a plurality of bump electrodes en bloc on an upper surface of a plurality of chips which are separated from a wafer and placed side by side, said upper surface constituting a bump electrode formation surface, comprising the steps of:

aligning the plurality of chips in a tray, filling depressed portions of an intaglio printing mask for the formation of bump electrodes with a liquid metal or an electroconductive paste, and performing printing with said liquid metal or said electroconductive paste filled in said depressed portions of said intaglio printing mask for the formation of said bump electrodes en bloc on said bump electrode formation surface by bringing said intaglio printing mask into close contact with said bump electrode formation surface so as to fix said liquid metal or said electroconductive paste thereon from said depressed portions of said intaglio printing mask.

15. The method as claimed in claim 14, wherein said electroconductive paste is a photo-setting paste, and said intaglio printing mask is transparent so as to cause light to pass at least through said depressed portions of said intaglio printing mask, thereby curing said photo-setting paste in said depressed portions when exposed to light, and comprises a light-shielding layer at least on such a side of said intaglio printing mask that comes into close contact with said bump electrode formation surface, and said photo-setting paste is filled in said depressed portions, exposed to light and cured, and said intaglio printing mask is then separated from said bump electrode formation surface so as to fix said cured photo-setting paste to said bump electrode formation surface for the formation of said bump electrodes en bloc thereon.

16. The method as claimed in claim 14, wherein said intaglio printing mask comprises a plastic material that can be selectively subjected to ablation working by light irradiation so as to form said depressed portions in said intaglio printing mask.

17. The method as claimed in claim 14, wherein said electronductive paste is an elastomer resin paste.

18. The method as claimed in claim 14, wherein said bump electrodes each have a conical shape.

19. A method of forming a plurality of bump electrodes en bloc on an upper surface of a plurality of chips which are separated from a wafer and placed side by side, said upper surface constituting a bump electrode formation surface, comprising the steps of:

aligning the plurality of chips in a tray, forming an electroconductive photosensitive layer on said bump electrode formation surface, exposing said electroconductive photosensitive layer to light through a photomask for the formation of said bump electrodes en bloc on said bump electrode formation surface, and developing said electroconductive photosensitive layer so as to form said bump electrodes en bloc on said bump electrode formation surface.

20. The method as claimed in claim 19, wherein said electroconductive photosensitive layer is successively exposed to light through said photo mask for the formation of said bump electrodes en bloc on said bump electrode formation surface, while a predetermined positional registration of said photo mask relative to said bump electrode formation surface is maintained.

\* \* \* \* \*

UNITED STATES PATENT AND TRADEMARK OFFICE
CERTIFICATE OF CORRECTION

PATENT NO.   : 6,225,205 B1
DATED        : May 1, 2001
INVENTOR(S)  : Makoto Kinoshita It is certified that error appears in the above-identified patent and that said Letters Patent is hereby corrected as shown below:

Column 5,
Line 46, change "and" to -- to --.

Column 6,
Line 38, change "1(c)" to -- 1(b) --.

Column 8,
Line 24, before "liquid", insert -- applied --;
Line 28, change "in" to -- is --.

Column 9,
Line 19, change "polymers" to -- polymer --;
Line 20, change "solders" to -- solder --; and change "pastes", in first and second occurrences, to -- paste --;
Line 21, change "agents" to -- agent --;
Line 22, change "agents" to -- agent --;
Line 23, change "polymers" to -- polymer --; change "or" to -- and --; change "pastes" to -- paste --;
Line 28, change "or" to -- and --.

Column 10,
Line 2, change "the" to -- an --;
Line 14, change "electroconductive" to -- electroconductive, --;
Line 29, change "an" to -- any --.

UNITED STATES PATENT AND TRADEMARK OFFICE
CERTIFICATE OF CORRECTION

PATENT NO. : 6,225,205 B1
DATED : May 1, 2001
INVENTOR(S) : Makoto Kinoshita

It is certified that error appears in the above-identified patent and that said Letters Patent is hereby corrected as shown below:

Column 12,
Line 10, change "therein" to -- thereon --;
Line 32, change "block" to -- bloc --.

Column 14,
Line 7, delete "the" in the second occurrence;
Line 42, change "an" to -- and --.

Column 15,
Line 1, change "block" to -- bloc --.

Column 16,
Line 67, change "electronductive" to -- electroconductive --.

Column 17,
Line 12, change "photomask" to -- photo mask --.

Signed and Sealed this

Eighth Day of January, 2002

*Attest:*

JAMES E. ROGAN
*Director of the United States Patent and Trademark Office*

*Attesting Officer*